US008564345B2

(12) United States Patent
Yu

(10) Patent No.: US 8,564,345 B2
(45) Date of Patent: Oct. 22, 2013

(54) DIGITALLY CONTROLLED DELAY LINES WITH FINE GRAIN AND COARSE GRAIN DELAY ELEMENTS, AND METHODS AND SYSTEMS TO ADJUST IN FINE GRAIN INCREMENTS

(75) Inventor: Wing K. Yu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/078,609

(22) Filed: Apr. 1, 2011

(65) Prior Publication Data

US 2012/0249200 A1    Oct. 4, 2012

(51) Int. Cl.
*H03L 7/06* (2006.01)
(52) U.S. Cl.
USPC ........... 327/158; 327/156; 327/276; 327/278; 375/371; 375/375; 375/376; 331/17
(58) Field of Classification Search
USPC ......................................... 327/156, 158, 161
See application file for complete search history.

(56) References Cited

U.S. PATENT DOCUMENTS

| 6,628,154 | B2  |   | 9/2003  | Fiscus          |         |
|-----------|-----|---|---------|-----------------|---------|
| 7,009,433 | B2  |   | 3/2006  | Zhang et al.    |         |
| 7,349,513 | B2  | * | 3/2008  | Bhullar et al.  | 375/375 |
| 7,518,422 | B2  | * | 4/2009  | Johnson         | 327/158 |
| 2008/0143405 | A1 |  | 6/2008  | Bhullar et al.  |         |
| 2009/0289676 | A1 |  | 11/2009 | Takai           |         |
| 2011/0215851 | A1 | * | 9/2011  | Oh et al.       | 327/158 |
| 2012/0126868 | A1 | * | 5/2012  | Machnicki et al. | 327/158 |

FOREIGN PATENT DOCUMENTS

WO    2012/135102 A2    10/2012

OTHER PUBLICATIONS

Gupta, Shankar "Features of Differential Delay Line used on the Embedded Ultra Low Power Intel486 Processor," APC Design Engineering, Retrieved on: Mar. 31, 2011, Webpage Available at: http://www.intel.com/design/intarch/papers/ddl486.htm.
Christiansen, Jørgen "An Integrated High Resolution CMOS Timing Generator Based on an Array of Delay Locked Loops," IEEE Journal of Solid-State Circuits, vol. 31, No. 7, Jul. 1996, pp. 952-957.
Suzuki, et al., "A Digitally Skew Correctable Multi-Phase Clock Generator Using a Master-slave DLL," Proceedings of the 2003 International Symposium on Circuits and Systems, 2003. ISCAS '03, May 25-28, 2003, vol. 1, I-105-I-108.
International Search Report and Written Opinion received for Patent Application No. PCT/US2012/030532, mailed on Oct. 23, 2012, 11 pages.

(Continued)

*Primary Examiner* — John Poos
(74) *Attorney, Agent, or Firm* — Garrett IP, LLC

(57) ABSTRACT

Digitally controllable delay lines including fine grain and coarse grain delay elements, and methods and system to calibrate the delay lines in fine grain increments. Calibration may include calibrating a number of fine grain elements for which a combined delay is substantially equal to a delay of a coarse grain element, and calibrating numbers of fine grain and coarse grain elements which a combined delay corresponds to a period of a reference clock. A digitally controlled delay line may be implemented as part of a digital delay locked loop (DLL), and calibration parameters may be provided to a slave DLL having a similarly implemented delay line. A digitally controllable DLL may provide relatively low-power, high-resolution over a spectrum of process, voltage, and temperature variations, and may be implemented in relatively high-speed applications previously reserved for analog DLLs.

17 Claims, 11 Drawing Sheets

(56) References Cited

OTHER PUBLICATIONS

Office Action Received for Chinese Patent Application No. 201220201768.1, mailed on Sep. 12, 2012, 2 Pages of Office action including 2 pages of English translation.

Office Action received for Chinese Patent Application No. 201220201768.1, mailed on Mar. 22, 2013, 4 pages of Office Action including 2 pages of English Translation.

* cited by examiner

DIGITALLY CONTROLLED DELAY LINES WITH FINE GRAIN AND COARSE GRAIN DELAY ELEMENTS, AND METHODS AND SYSTEMS TO ADJUST IN FINE GRAIN INCREMENTS

BACKGROUND

Delay locked loops (DLLs) are designed to provide phase-delayed clock signals that are relatively stable across process, voltage, and temperature (PVT) variations.

DLLs include analog DLLs and digital DLLs.

Conventional digital DLLs may consume less power, operate at lower voltage applications, and provide greater process portability for reuse compared with conventional analog DLLs.

Analog DLLs may provide more precise control of phase clock delay, and thus greater resolution, compared with conventional digital DLLs.

BRIEF DESCRIPTION OF THE DRAWINGS/FIGURES

Figure 1:
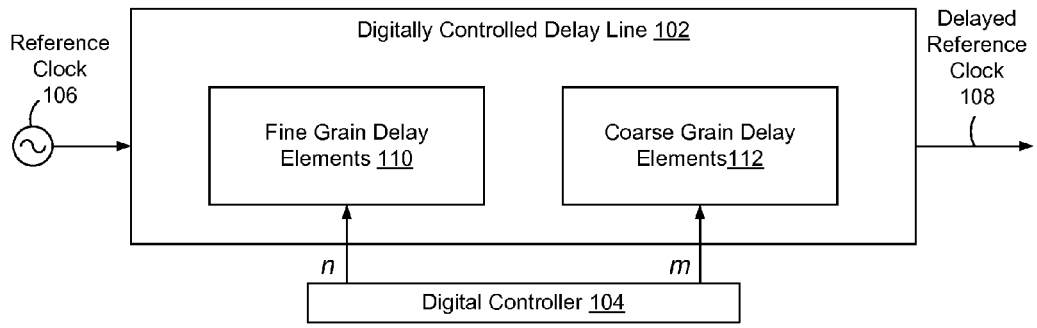
FIG. 1 is a block diagram of digitally controlled delay line, including fine grain delay elements and coarse grain delay elements, and a digital controller to control the delay line in fine grain and coarse grain increments.

In the drawings, the leftmost digit(s) of a reference number identifies the drawing in which the reference number first appears.

DETAILED DESCRIPTION

Disclosed herein are digitally controllable delay lines having fine grain and coarse grain delay elements, and methods and system to adjust delay in relatively fine grain increments.

FIG. 1 is a block diagram of digitally controlled delay line 102, and a digital controller 104 to control delay line 102. Controller 104 may control delay line 102 to output a phase-delayed version of a reference clock 106, illustrated here as a delayed reference clock 108.

Delay line 102 includes a plurality of first and second delay elements, wherein a combined delay of a plurality of the first delay elements is substantially equal to a delay of each of the second delay elements imparts.

For illustrative purposes, the first delay elements are referred to herein as fine grain delay elements, and the second delay elements are referred to herein as coarse grain delay elements. The terms fine and coarse are used herein relatively. Neither the first nor second delay elements are limited to a particular amount or range of delay.

In FIG. 1, first and second delay elements are illustrated as fine grain delay elements 110, and coarse grain delay elements 112, respectively.

Fine grain delay elements 110 and coarse grain delay elements 112 may be implemented as corresponding delay lines, such as described below with reference to FIG. 2.

Figure 2:
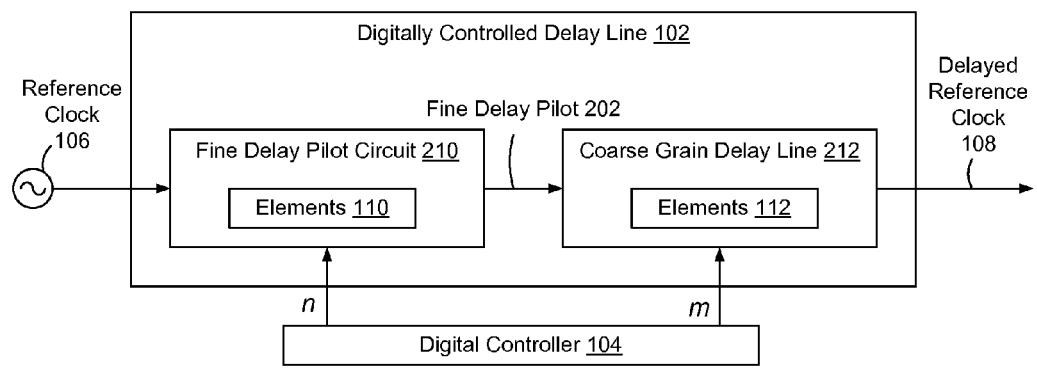
FIG. 2 is a block diagram of the digitally controlled delay line of FIG. 1, where the fine grain delay elements are implemented as a fine grain delay line and the coarse grain delay elements are implemented as a coarse grain delay line to receive an output of the fine grain delay line.

FIG. 2 is a block diagram of delay line 102, wherein fine grain delay elements 110 are implemented as a fine delay pilot circuit 210, and coarse grain delay elements 112 are implemented as a coarse grain delay line 212.

Coarse grain delay line 212 may include an array of relatively coarse grain delay elements or cells implemented with buffers and multiplex logic.

Fine grain delay elements 110 may include an array of switch-controlled capacitors, each of which may be selectively coupled to a node to add a resistive/capacitive (RC) load to the node. When a capacitor is switched in, the corresponding RC load delays rise and fall times of a reference clock at the node by an incremental amount, which may be a fraction of a delay of a coarse grain delay element 112. The incremental delay may define a resolution of digital delay line 102, which may permit delay line 102 to be tuned to within at least a resolution of an analog delay line.

In FIG. 2, fine delay pilot circuit 210 is implemented to receive reference clock 106 and to output a fine delay pilot 202, and coarse grain delay line 212 is implemented to receive fine delay pilot 202 and to output delayed reference clock 108. Digitally controlled delay line 102 is not, however, limited to the example of FIG. 2.

In FIG. 1 and/or FIG. 2, digital controller 104 may be implemented to adjust delay line 102 in relatively fine steps. For each increment or decrement, a subset of one or more fine grain delay elements 110 may be enabled or disabled, or added to or subtracted from delay line 102. When a number of enabled fine grain delay elements 110 corresponds to the delay of a coarse grain delay element 112, the number of fine grain delay elements 110 may be switched out or in, in place of a coarse grain delay element 112.

Controller 104 may include a first counter to control the number of enabled fine grain delay elements 110. When a decision is made to increase delay, the first counter may be incremented and a fine grain delay element 110 may be enabled or added to delay line 102. When an accumulated increment is equivalent to the delay of a coarse grain delay element 112, a coarse grain delay element 112 may be added or enabled and the counter may be reset. Conversely, when an accumulated decrement is equivalent to the delay of a coarse grain delay element 112, a coarse grain delay element 112 may be removed or disabled and the first counter may be incremented to a value of 1 less than the equivalent of a coarse grain delay element 112.

Controller 104 may be implemented to control fine grain delay elements 110 and coarse grain delay elements 112 with corresponding variables n and m.

Controller 104 may be implemented to control n and m with positional notation counting, where n and m correspond to least and most significant positions, and with a radix is defined by the number of fine grain delay elements 110 for which a combined delay is substantially equal to the delay of a coarse grain delay element 112. The radix is also referred to herein as a fine-to-coarse grain conversion factor or, more simply, conversion factor.

As an example, where the delay of a coarse grain delay element 112 is substantially equal to the combined delay of 8 fine grain delay elements 110, the conversion factor equals 8.

The first counter may be configurable to signal a carry-out for different conversion factors, such as, without limitation, 4, 5, 6, 7, and/or 8.

Controller 104 may be implemented to calibrate the conversion factor based on measured delay of one or more fine grain delay elements 110 and one or more coarse grain delay elements 112, and to configure the first counter based on the calibration. Calibration of the conversion factor and configuration of the counter may help to maintain accuracy over process, voltage and/or temperature (PVT) variations.

Figure 3:
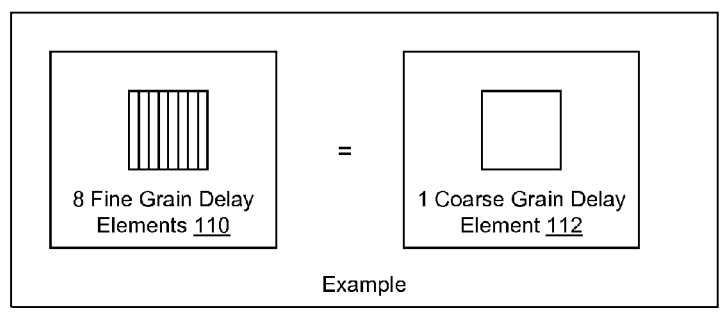
FIG. 3 is a depiction of an example in which a delay of a coarse grain delay element is substantially equal to a combined delay of 8 fine grain delay elements.

Example illustrations of incremental adjustments of delay are provided in FIGS. 3 through 3.

FIG. 3 is a depiction of an example where a combined delay of 8 fine grain delay elements 110 is substantially equal to the delay of a coarse grain delay element 112.

Figure 4:
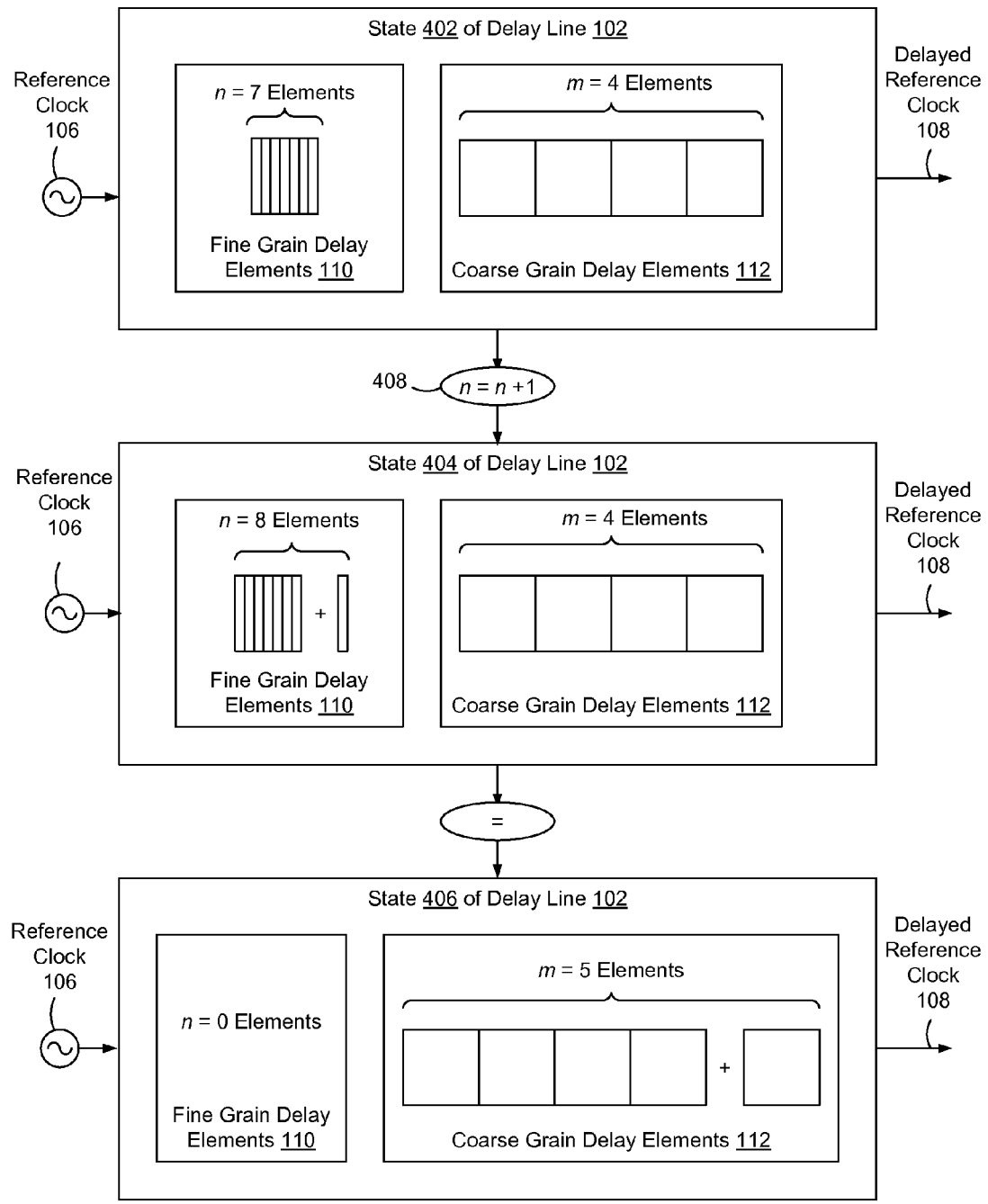
FIG. 4 is a depiction of example states of the digitally controlled delay line of FIG. 1 to illustrate an incremental increase in delay.
Figure 5:
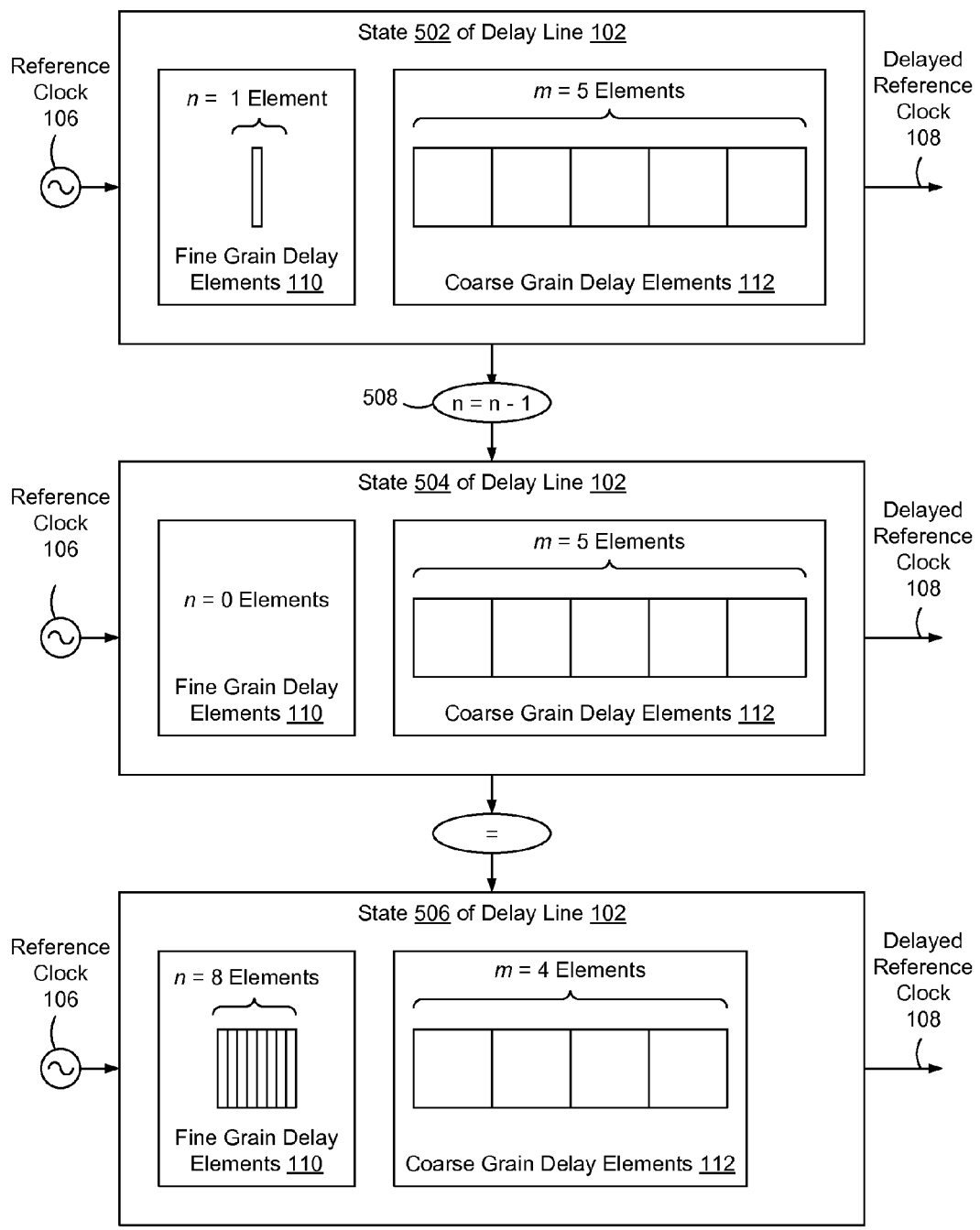
FIG. 5 is a depiction of states of the digitally controlled delay line of FIG. 1 to illustrate an incremental decrease in delay.

FIGS. 4 and 5 are based on the example of FIG. 3. Methods and systems disclosed herein are not, however, limited to these examples.

FIG. 4 is a depiction of states 402, 404, and 406, of delay line 102, to illustrate an incremental increase in delay.

At state 402, 7 fine grain delay elements 110 and 4 coarse grain delay elements 112 are enabled, corresponding to n=7 and m=4.

At 408, a determination may be made to increment the delay. This may be accomplished by enabling another fine grain delay element 110, such as illustrated at state 404, where n=8 and m=4.

Alternatively, the increment may be accomplished by enabling another coarse grain delay element 112 and disabling 7 fine grain delay elements 110, such as illustrated at state 406, where n=0 and m=5.

FIG. 5 is a depiction of states 502, 504, and 506, of delay line 102, to illustrate an incremental decrease in delay.

At state 502, 1 fine grain delay element 110 and 5 coarse grain delay elements 112 are enabled, corresponding to n=1 and m=5.

At 508, a determination may be made to decrement the delay. This may be accomplished by disabling one fine grain delay element 110, such as illustrated at state 504, where n=0 and m=5.

Alternatively, the decrement may be accomplished by disabling one coarse grain delay element 112 and enabling 7 fine grain delay elements 110, such as illustrated at state 506, where n=8 and m=4.

From either of states 504 and 506, a subsequent decrement may performed by setting n=7 and m=4.

Figure 6:
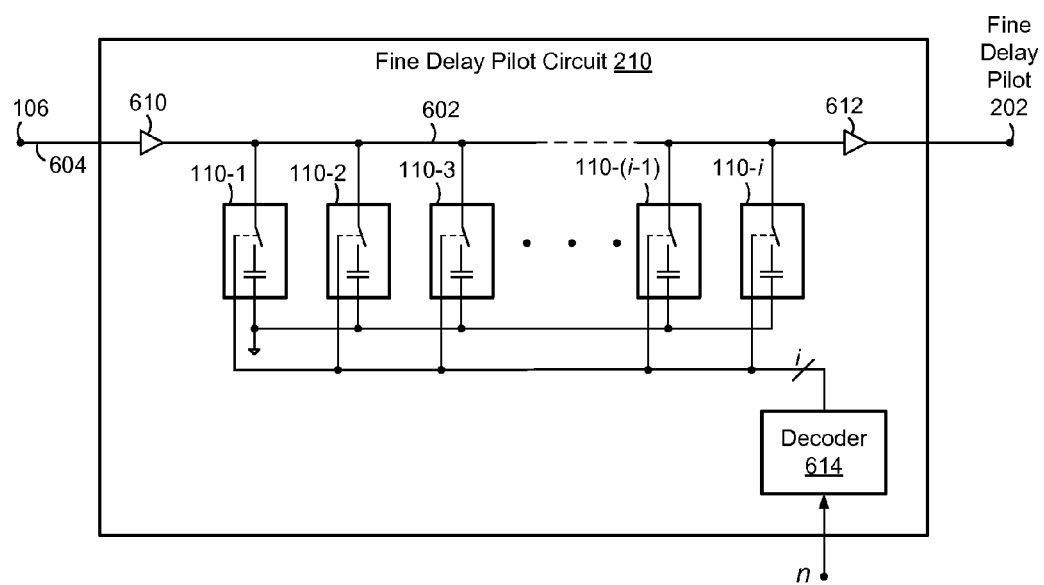
FIG. 6 is a block diagram of fine grain delay elements implemented as switch-controlled capacitors.

FIG. 6 is a block diagram of an example implementation of fine delay pilot circuit 210, where fine grain delay elements 110 include switch-controlled capacitor circuits 110-1 through 110-i.

Switch-controlled capacitor circuits 110-1 through 110-i may each be individually controllable to couple to a node 602.

Switch-controlled capacitor circuits 110-1 through 110-i may each add a relatively small resistive/capacitive (RC) load to node 602. A resistive portion of the RC loads may be provided by input buffer circuitry 610. Alternatively, or additionally, resistors may be provided within switch-controlled capacitor circuits 110-1 through 110-i.

When reference clock 106 is applied to an input node 604, each enabled RC load imparts a relatively small delay to rise and fall times of reference clock 106, to provide a phase-delayed version of reference clock 106 as fine delay pilot 202 at an output node 608.

In FIG. 6, control of switch-controlled capacitor circuits 110-1 through 110-i is illustrated with i controls 612, each to selectively add or remove a corresponding one of switch-controlled capacitor circuits 110-1 through 110-i.

Fine delay pilot circuit 210 may include a decoder 614 to generate the i controls 612 based on the value of n.

Fine delay pilot circuit 210 may include output buffer circuitry, illustrated here as an output buffer 612. Output buffer 612 may serve to isolate fine delay pilot circuit from a subsequent load, such as from coarse grain delay line 212.

In FIG. 6, delay provided by each fine grain delay element 212-1 through 212-j is substantially equal to one another, and substantially all logic circuitry that contributes delay to fine delay pilot circuit 210 is contained with fine grain delay elements 110. As described further below, calibration of delay line 102 substantially compensates for process, voltage, and temperature (PVT) variations that affect fine grain delay elements 110.

Figure 7:
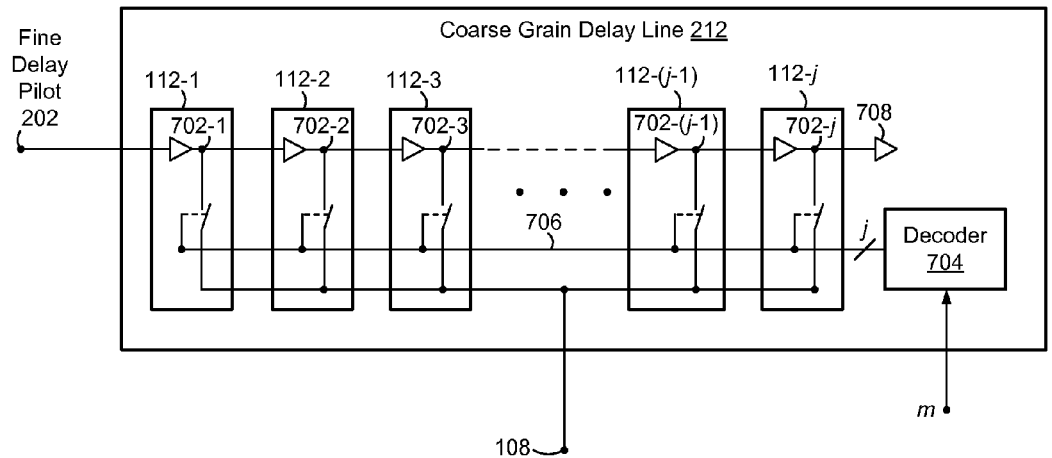
FIG. 7 is a block diagram of coarse grain delay elements implemented as series-connected buffers with switch-controlled outputs.

FIG. 7 is a block diagram of an example implementation of coarse grain delay line 212, where coarse grain delay elements 112 include buffers 212-1 through 212-j, and corresponding switch-controlled outputs 702-1 through 702-j. Coarse grain delay line 212 may include a decoder 704 to activate one of j switch controls 706, to selectively provide an output 702 of one of buffers 212-1 through 212-j, as delayed reference clock 108.

Coarse grain delay line 212 may include a buffer 708 to provide a load to output 702-j that is similar to loads of outputs 702-1 through 702-(j−1).

In FIG. 7, delay provided by each coarse grain delay element 212-1 through 212-j is substantially equal to one another, and substantially all logic circuitry that contributes delay to an output of coarse grain delay line 212 is contained with coarse grain delay elements 112. As described further below, calibration of delay line 102 substantially compensates for PVT variations that affect coarse grain delay elements 112.

Figure 8:
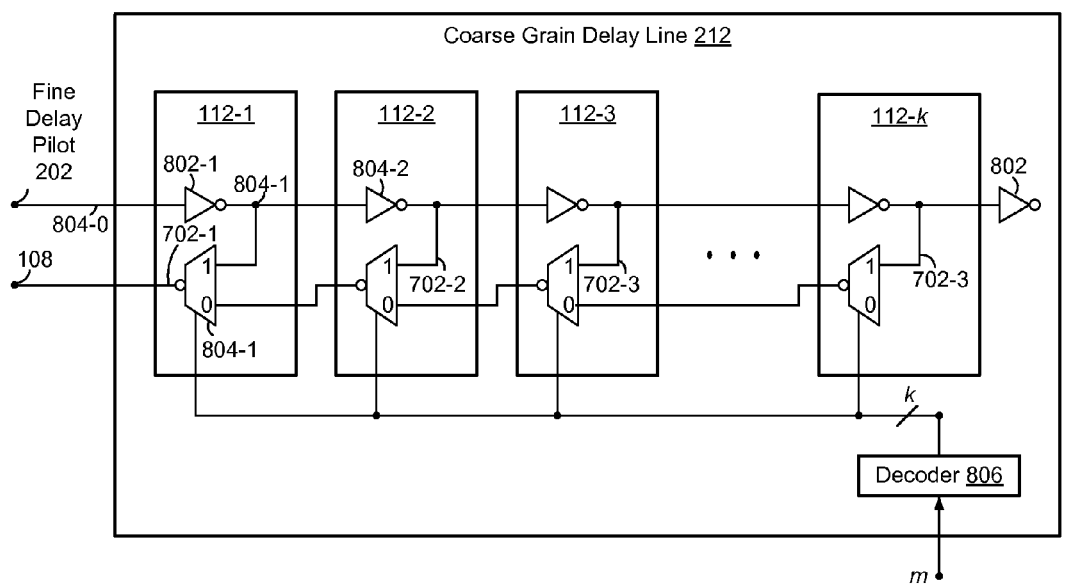
FIG. 8 is a logic diagram of coarse grain delay elements, each including an inverting buffer and a multiplexer.

FIG. 8 is a logic diagram of an example implementation of coarse grain delay line 212, where coarse grain delay elements 112 include buffers 212-1 through 212-k.

In FIG. 8, buffers 212-1 through 212-k each include an inverting buffer 802 and an inverting 2:1 multiplexer 804, and coarse grain delay line 212 includes a decoder 806 to selectively control multiplexers 804 based on a value of m.

In the example of FIG. 8, decoder 806 outputs a logic 1 to one of multiplexers 804, based on the value of m, and outputs logic 0 to remaining multiplexers 804.

In a first example, m=1 and decoder 806 outputs a logic 1 to multiplexer 804-1, and a logic 0 to multiplexers 804-2 through 804-k. This causes multiplexer 804-1 to invert the output of inverting buffer 802-1 as delayed reference clock 108. In this example, fine delay pilot 202 is inverted twice, and thus the same polarity as fine delay pilot 202, and is phase-delayed by one inverting buffer 802 and one multiplexer 804.

Outputs of multiplexers 804-2 through 804-k are not used when m=1.

In a second example, m=2 and decoder 806 outputs a logic 1 to multiplexer 804-2, and a logic 0 to remaining multiplexers 804-1, and 804-3 through 804-k. This causes multiplexer 804-2 to invert the output of inverting buffer 802-1, and causes multiplexer 804-1 to invert and output the output of multiplexer 804-2 as delayed reference clock 108. In this example, fine delay pilot 202 is inverted four times and thus has the same polarity as fine delay pilot 202, and is phase-delayed by two inverting buffers 802 and two multiplexers 804.

Outputs of multiplexers 804-3 through 804-k are not used when m=2.

In a third example, m=3 and decoder 806 outputs a logic 1 to multiplexer 804-3, and a logic 0 to remaining multiplexers 804-1, 804-2, and 804-4 through 804-k. This causes multiplexer 804-3 to invert the output of inverting buffer 802-2, multiplexer 804-2 to invert and output the output of multiplexer 804-3, and multiplexer 804-1 to invert and output the output of multiplexer 804-2 as delayed reference clock 108. In this example, fine delay pilot 202 is inverted six times and thus has the same polarity as fine delay pilot 202, and is phase-delayed by three inverting buffers 802 and three multiplexers 804.

Outputs of multiplexers 804-4 through 804-k are not used when m=3.

Based on the description herein, one skilled in the relevant art(s) will understand operation of delay elements 112-1 through 112-k for other values of m.

In FIG. 8, delay provided by each coarse grain delay element 212-1 through 212-k is substantially equal to one another, and substantially all logic circuitry that contributes delay to an output of coarse grain delay line 212 is contained with coarse grain delay elements 112. As described further below, calibration of delay line 102 substantially compensates for PVT variations that affect coarse grain delay elements 112.

Fine grain delay elements 110 may each be implemented to provide a delay of approximately ⅛ of the delay of one of the second delay elements, which may vary between approximate ⅕ to ¹⁄₁₀, in response to PVT variations.

Fine grain delay elements 110 may each be implemented with a delay of, for example, less than approximately 20 picoseconds (ps), which may vary between approximately 8 ps and 15 ps and due to PVT variations. Delay of fine grain delay elements 110 is not, however, limited to these examples.

Coarse grain delay elements 112 may each be implemented with a delay of, for example, approximately 130 ps, which may be subject to change due to PVT variations.

Delay of fine grain delay elements 110 and coarse grain delay elements 112 are not limited to examples herein.

Delay line 102 may be calibrated to compensate for changes in delay.

Digitally controlled delay line 102 and digital controller 104, as described in one or more examples above, may be implemented as a digital delay locked loop (DLL). A DLL, as disclosed herein, may be implemented as a master DLL to calibrate delay line 102. A DLL, as disclosed herein, may be implemented as a slave DLL to operate delay line 102 based on calibration parameters provided by a master DLL having a similarly implemented delay line.

Figure 9:
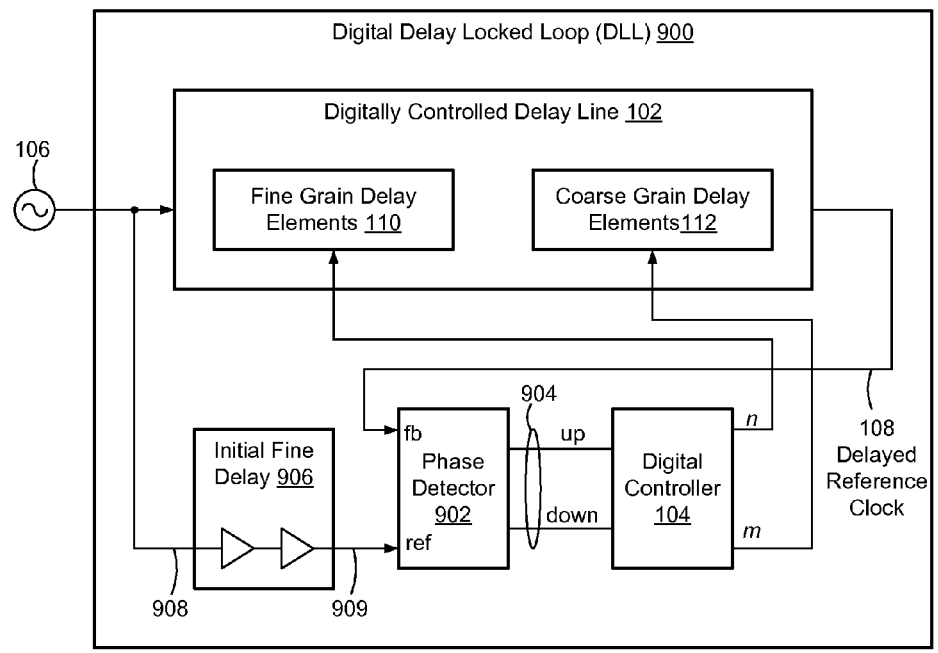
FIG. 9 is a block diagram of a digital delay locked loop (DLL), including the digitally controlled delay line digital controller of FIG. 2, and further including a phase detector, and an initial fine delay circuit to offset inherent delay of the delay line.

FIG. 9 is a block diagram of a digital DLL 900, including digitally controlled delay line 102 and digital controller 104, as illustrated in FIG. 2, and further including a phase detector 902. In FIG. 9, delayed reference clock 108 is illustrated as a feedback reference clock 908, and phase detector 902 is implemented to generate an indication 904 of a phase difference between reference clock 106 and feedback reference clock 908.

Phase detector 902 may be implemented to generate indication 904 based on arrival times of reference clock 106 and feedback reference clock 908, which may be based rising and/or falling edges of the clocks.

Phase detector 902 may be implemented to generate indication 904 as one of two states. A first state, illustrated here as "up," may correspond to reference clock 106 leading delayed reference clock 108, and may be used to indicate a need to increase the delay of delay line 102. A second state, illustrated here as "down," may correspond to reference clock 106 lagging delayed reference clock 108, and may be used to indicate a need to decrease the delay of delay line 102.

Digital controller 104 may be implemented to adjust n and m to substantially align a rising edge of reference clock 106 with a rising edge of feedback reference clock 908 generated from a preceding cycle of reference clock 106. At such an alignment, n and m represent or correspond to a period of reference clock 106, and may be output to a slave delay line such as described in one or more examples below.

A resolution of indication 904 may be defined as the delay of a fine grain delay element 110, rather than the delay of a coarse grain delay element 112, as is the case with a conventional digital DLL. A delay of a fine grain delay element 110 may be equivalent to or better than a resolution of an analog DLL.

Fine delay pilot circuit 210 may include an inherent resistance and an inherent capacitance that may imparts a delay to reference clock 106, including when none of fine grain delay elements 110 are coupled to node 602. The inherent resistance and capacitance may arise from input buffer circuitry 610, output buffer circuitry 612, and/or other circuitry.

DLL 900 may include an initial fine delay circuit 906 to cancel or compensate for such inherent resistance and capacitance of fine delay pilot circuit 210. Initial fine delay circuit 906 may include circuitry that is similar to circuitry of fine delay pilot circuit 210, such as described below with reference to FIG. 10.

Figure 10:
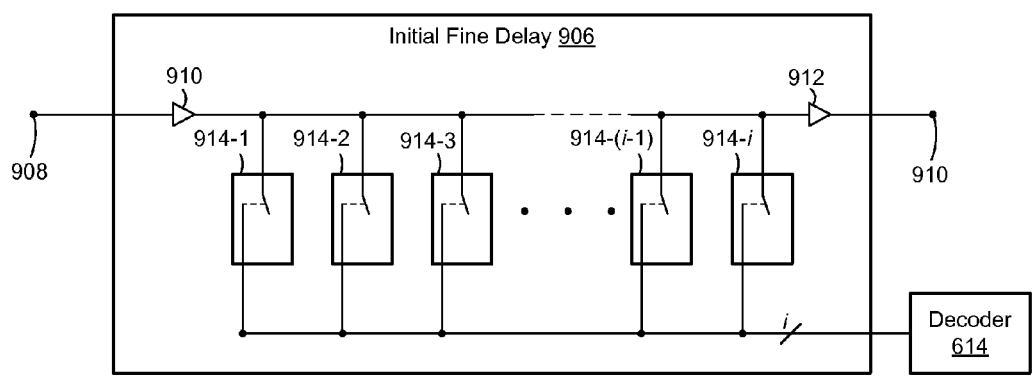
FIG. 10 is a block diagram of an example implementation of the initial fine delay circuit.

FIG. 10 is a block diagram of an example implementation of initial fine delay circuit 906, including buffer circuitry 910 and 912, which may be similar or identical to input buffer circuitry 610 and output buffer circuitry 612, respectively, of fine delay pilot circuit 102 in FIG. 6. Initial fine delay circuit 906 may include switch circuits 914-1 through 914-i, each of which may include switch circuitry that is similar or identical to switch circuitry of switch-controlled capacitor circuits 110-1 through 110-i of FIG. 6.

Similarities between initial fine delay circuit 906 and fine delay pilot circuit 102 may help to maintain accuracy over PVT variations.

Figure 11:
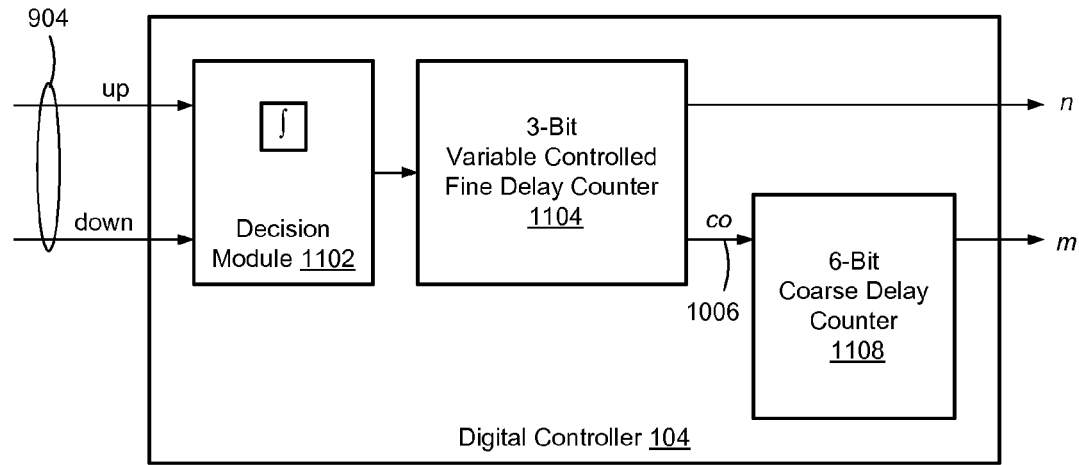
FIG. 11 is a block diagram of the digital controller, including first and second counters to control the delay line based on phase differences, wherein the first and second counters form part of a first calibration loop to calibrate the delay line relative to a period of a reference clock.

FIG. 11 is a block diagram of digital controller 104, including a counter 1104 to increment and decrement based on phase difference indication 904 of FIG. 9.

Digital controller 104 may include a decision module 1102 to evaluate phase difference indication 904 over time, which may include an integration function. Digital controller 104 may be implemented to selectively increment and decrement counter 1104 based on the evaluation.

Alternatively, counter 1104 may be implemented to increment and decrement in direct response to up and down indications of phase difference indication 904.

Controller 104 may include an asynchronous state machine, and may include a finite state machine (FSM).

Counter 1104 may be implemented to output a carry-out indication 1106 when a count threshold is reached. The count threshold may correspond to the conversion factor between fine grain delay elements 110 and coarse grain delay elements 112.

Counter 1004 may be configurable to generate carry-out 1006 at one of a plurality of selectable thresholds, such as to accommodate multiple conversions factors, which may include, without limitation, every 4, 5, 6, 7, or 8. Carry-out 1106 may be reconfigured in response to changes in the conversion factor, which may be due to PVT variations.

Digital controller 104 may include a second counter 1108 to increment and decrement based on carry-out indications 1106.

Digital controller 104 may be implemented to control the number of enabled or selected fine grain delay elements 110, n, based on counter 1104, and to control the number of enabled or selected coarse grain delay elements 112, m, based on counter 1108.

Counter 1104 may include a 3-bit variable counter, and counter 1108 may include a 6-bit counter, as illustrated in FIG. 11. Counters 1104 and 1108 are not, however, limited to the example of FIG. 11.

In FIGS. 9 and 11, a combination of digitally controlled delay line 102, phase detector 902, counters 1104 and 1108, and decision module 1002, are referred to herein as a first calibration loop to calibrate or determine values of n and m that correspond to a cycle of reference clock 106.

A DLL may include a second calibration loop to determine a fine-to-coarse conversion factor P, based on measured delays of one or more fine grain delay elements 110 and one or more coarse grain delay elements 112, such as described below with reference to FIGS. 12 and 13.

Figure 12:
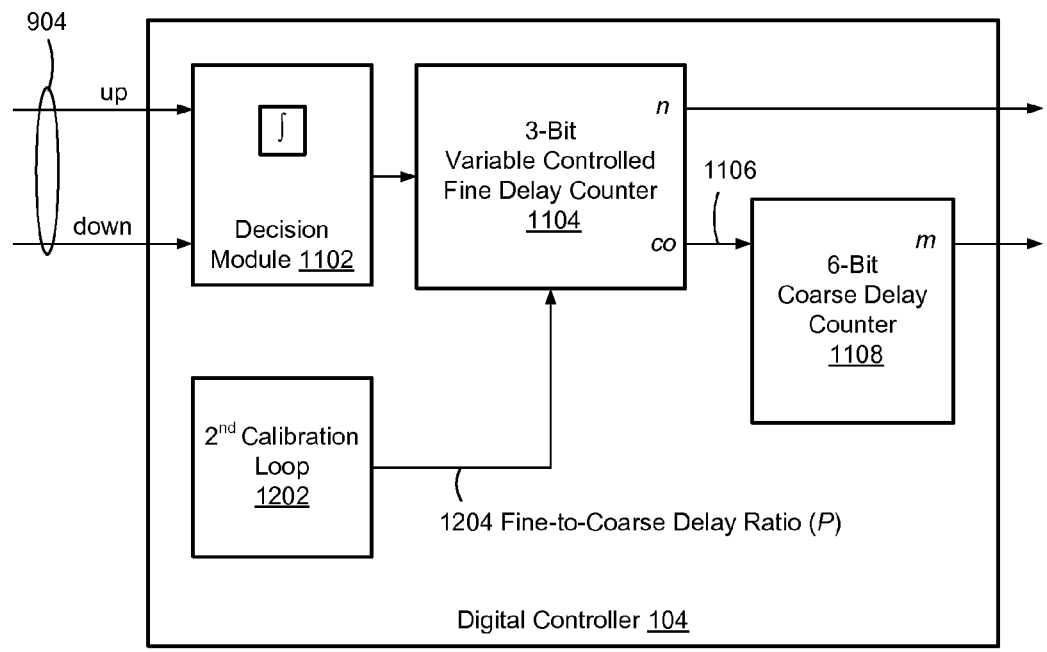
FIG. 12 is a block diagram of the digital controller as illustrated in FIG. 11, further including a conceptual representation of a second calibration loop 1202 to calibrate a fine-to-coarse conversion factor, which may applied as a carry-out threshold of the first counter.

FIG. 12 is a block diagram of digital controller 104 as illustrated in FIG. 11, further including a conceptual representation of a second calibration loop 1202 to determine fine-to-coarse conversion factor P, illustrated at 1204. Conversion factor P may be used to configure the carry-out threshold of counter 1104.

Figure 13:
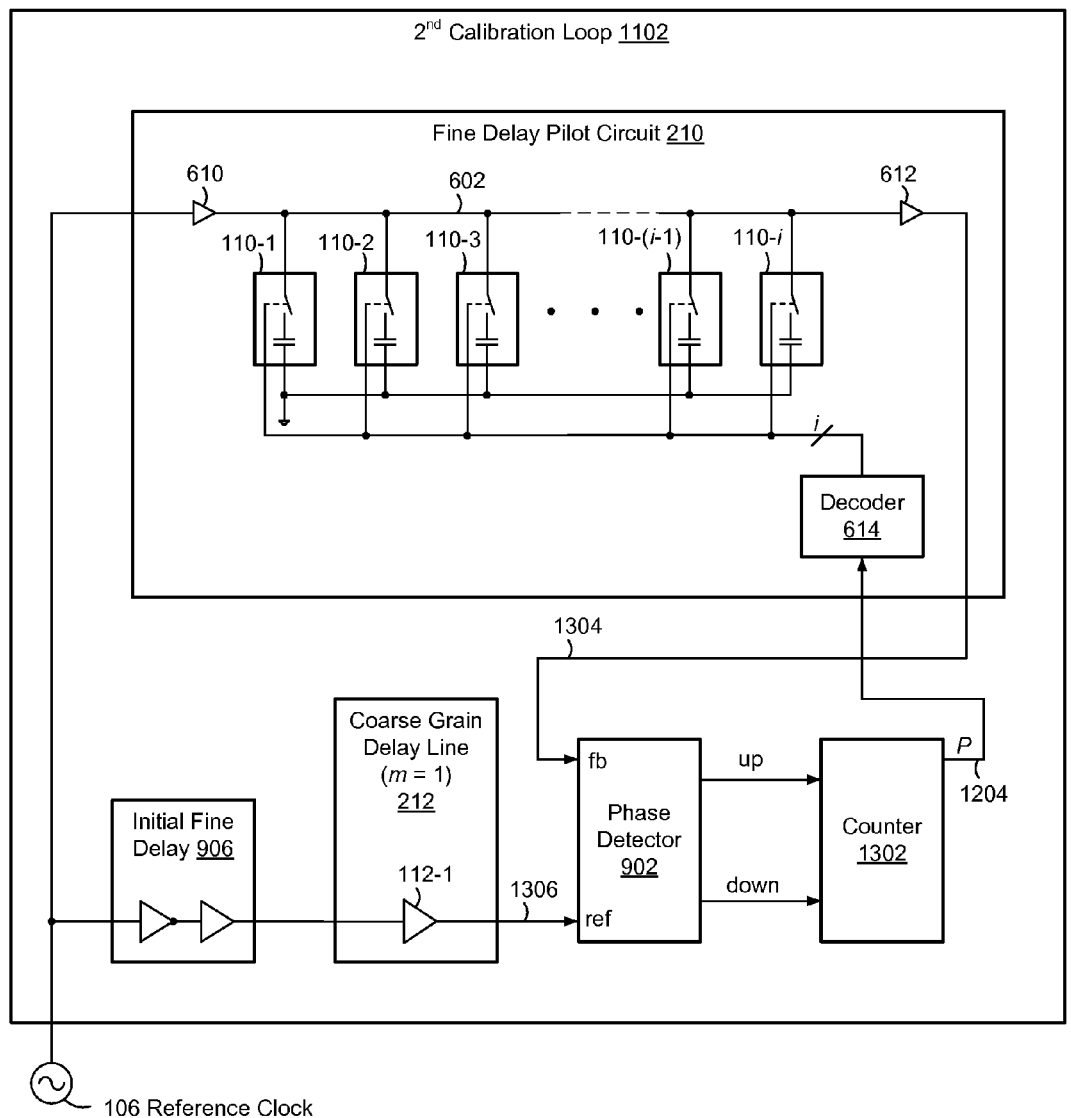
FIG. 13 is a block diagram of an example implementation of the second calibration loop, including a third counter to increment and/or decrement the fine-to-coarse conversion factor.

FIG. 13 is a block diagram of an example implementation of second calibration loop 1202, including a counter 1302 to increment and/or decrement a value of fine-to-coarse conversion factor P. Counter 1302 may be correspond to counter 1104 in FIG. 11, or may be implemented as another counter.

During calibration of fine-to-coarse conversion factor P, reference clock 106 is provided to fine delay pilot circuit 210 to generate a feedback reference clock 1304 to phase detector 902. Reference clock 106 is also provided to initial fine delay circuit 906 and to coarse train delay line 212 to provide a reference clock 1306 to phase detector 902.

Also during calibration of fine-to-coarse conversion factor P, m may be set to 1, P may be initialized to zero, and phase detector 902 may adjust P to substantially align a rising edge of reference clock 1304 with a rising edge of feedback reference clock 1302 generated from a preceding cycle of reference clock 106. At such an alignment, P represents or corresponds to a number of fine grain delay elements 110 for which a combined delay substantially equals a delay of a fine grain delay element 112.

Calibrated values of n, m, and/or P may be provided to one or more slave delay lines, such as described below with reference to FIG. 14.

Figure 14:
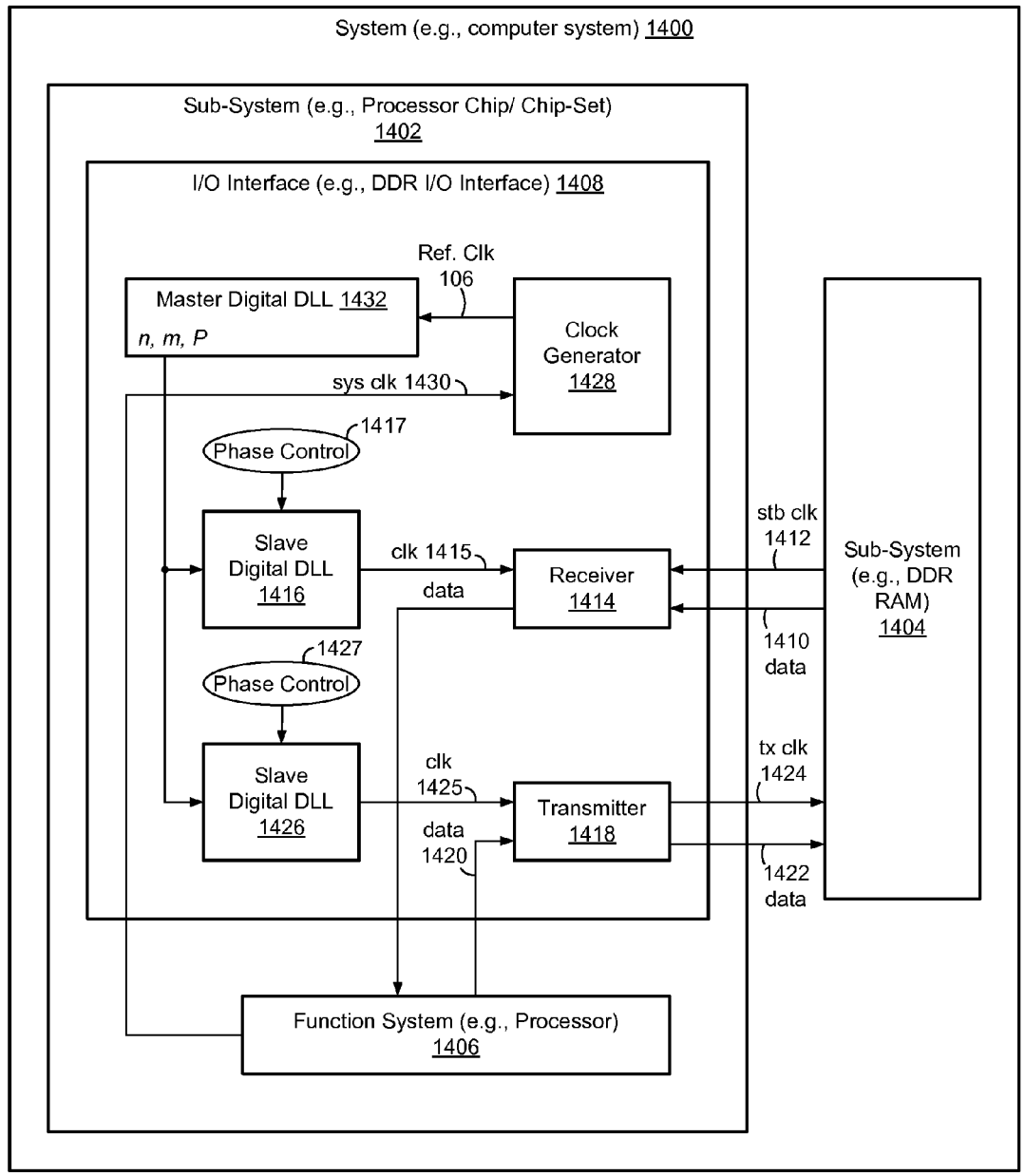
FIG. 14 is a block diagram of a system, including a master DLL having a digitally controllable delay line as described herein.

FIG. 14 is a block diagram of a system 1400, which may include a processor based system.

System 1400 may include sub-systems 1402 and 1404, each of which may correspond to, without limitation, an integrated circuit, an integrated circuit die or chip, a circuit board, a physical device of a computer system, and/or a portion thereof.

Sub-system 1402 may include a function system 1406, which may include integrated circuit logic and/or a processor. Sub-system 1402 may further include an input/output (I/O) interface 1408 to interface between function system 1406 and sub-system 1404.

Sub-system 1404 may include, for example, dynamic random access memory (DRAM), and may include asynchronous DRAM.

Sub-system 1404 may be implemented to transmit data 1410 and an associated strobe clock 1412. Data transitions of transmit data 1410 may occur at rising and falling edges of strobe clock 1412, referred to as a double data rate (DDR).

I/O interface 1408 may include a receiver 1414 to sample data 1410. Timing of receiver 1414 may be controlled so that data 1410 is sampled between data transitions, referred to as a center of an eye of data 1410. Timing of receiver 1414 may be controlled by a slave digital DLL 1416, described below.

I/O interface 1408 may include a transmitter 1418 to transmit data 1420 to sub-system 1404 as data 1422. Timing of transmitter 1418 may be controlled so that an eye an eye of data 1422 is substantially centered at transitions of a transmit clock 1424, to permit sub-system 1404 to sample transmit data 1422 based on transmit clock 1424. Timing of transmitter 1418 may be controlled by a slave digital DLL 1426, described below.

I/O interface 1408 may include a clock generator 1428 to generate reference clock 106 from a system clock 1430.

I/O interface 1408 may include a master digital DLL 1432 to calibrate values of n, m, and P for a period of reference clock 106, such as described in one or more examples herein. Slave DLLs 1416 and 1426 may be implemented to generated corresponding clocks 1415 and 1425, based on the values of n, m, and P, and corresponding phase controls 1417 and 1427.

Slave digital DLLs 1416 and 1426 may be implemented to receive updated values of n, m, and P from master digital DLL 1432 continuously or from time to time, which may be periodic or scheduled. Updated values of n, m, and P may be provided synchronously or asynchronously.

Master digital DLL 1432 may be implemented to run continuously, and may switch between calibration of n and m, and calibration of P.

Alternatively, master digital DLL 1432 may be enabled from time to time to calibrate P, n and m, and may be disabled otherwise.

When operated continuously, master digital DLL 1432 may consume approximately 1/30 of the power of an analog master DLL having similar resolution, and may consume even less power when operated disabled from time to time.

Master digital DLL 1432 may include a timer circuit to turn internal clocks on and off based on a schedule. When the internal clocks are off, calibrated values of n, m, and P may be retained in counter registers, and current through the digital DLL may be close to a leakage current.

The timer may be implemented to control the internal clocks with an on/off time ratio of, for example, up to 100%, 50%, 25%, 10%, 1%, or less. For example, the timer may be implemented to turn off internal clocks for a period of 5 micro-seconds, and to turn the internal clocks on for a period of 50 nano-seconds.

Master digital DLL 1432 may be implemented to perform approximately 200,000 updates per second.

Methods of calibrating a digitally controllable delay line, as disclosed herein, are described below with reference to FIGS. 15 and 16.

Figure 15:
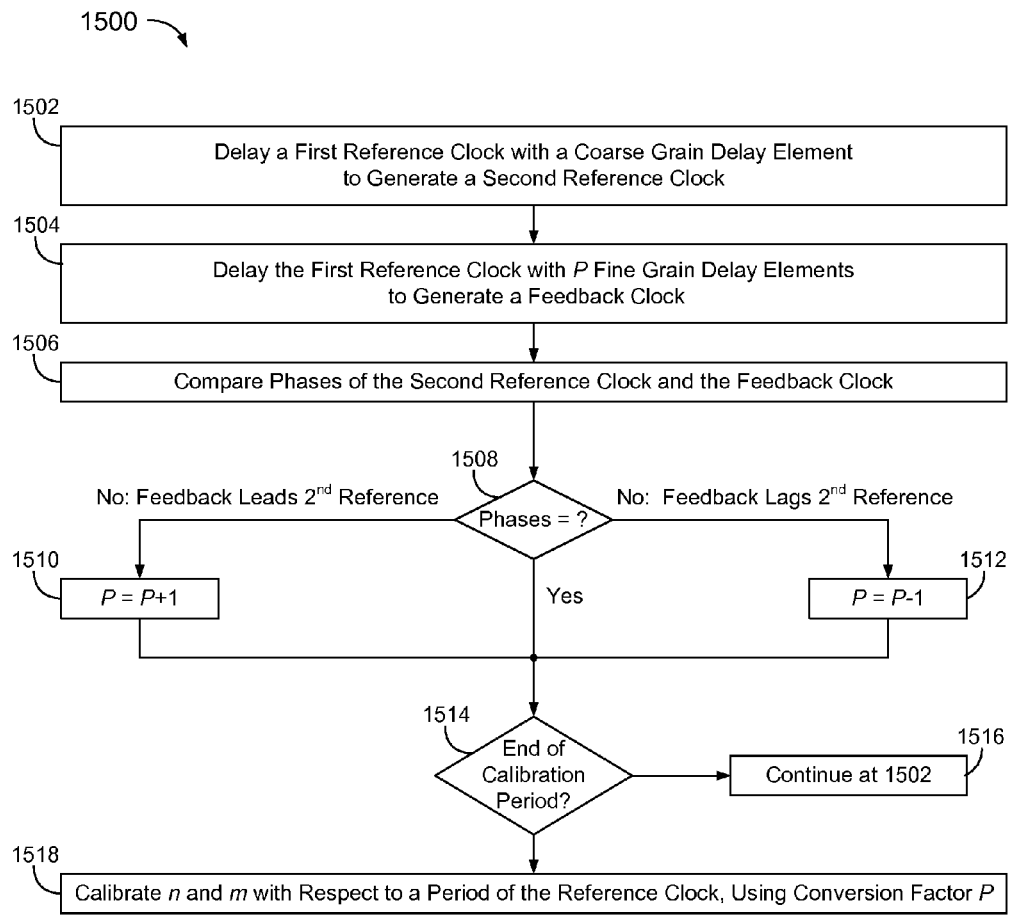
FIG. 15 is a flowchart of a method of calibrating the number of fine grain delay elements, P, for which a combined delay is substantially equal to a delay of one of the coarse grain delay elements.

FIG. 15 is a flowchart of a method 1500 of calibrating the number of first delay elements, P, for which a combined delay is substantially equal to a delay of one of the second delay elements.

At 1502, a first reference clock is delayed with one of the second delay elements to generate a second reference clock.

At 1504, the first reference clock is delayed with P first delay elements to generate a feedback clock.

At 1506, phases of the second reference clock and the feedback clock are compared. The comparing may include examining state transitions, such as rising or falling edges, and may include detecting a first-to-arrive based on state transitions.

At 1508, when the feedback clock leads the second reference clock, processing proceeds to 1510, where P is incremented to increase the delay of the delay line.

When the feedback clock lags the second reference clock at 1508, processing proceeds to 1512, where P is decremented to decrease the delay of the delay line.

Calibration of P may continue as illustrated at 1516. Calibration of P may continue for a period of time, which may be a pre-determined period of time.

When calibration of P ends at 1514, P may be used to calibrate n and m, such as described below with reference to FIG. 16.

Figure 16:
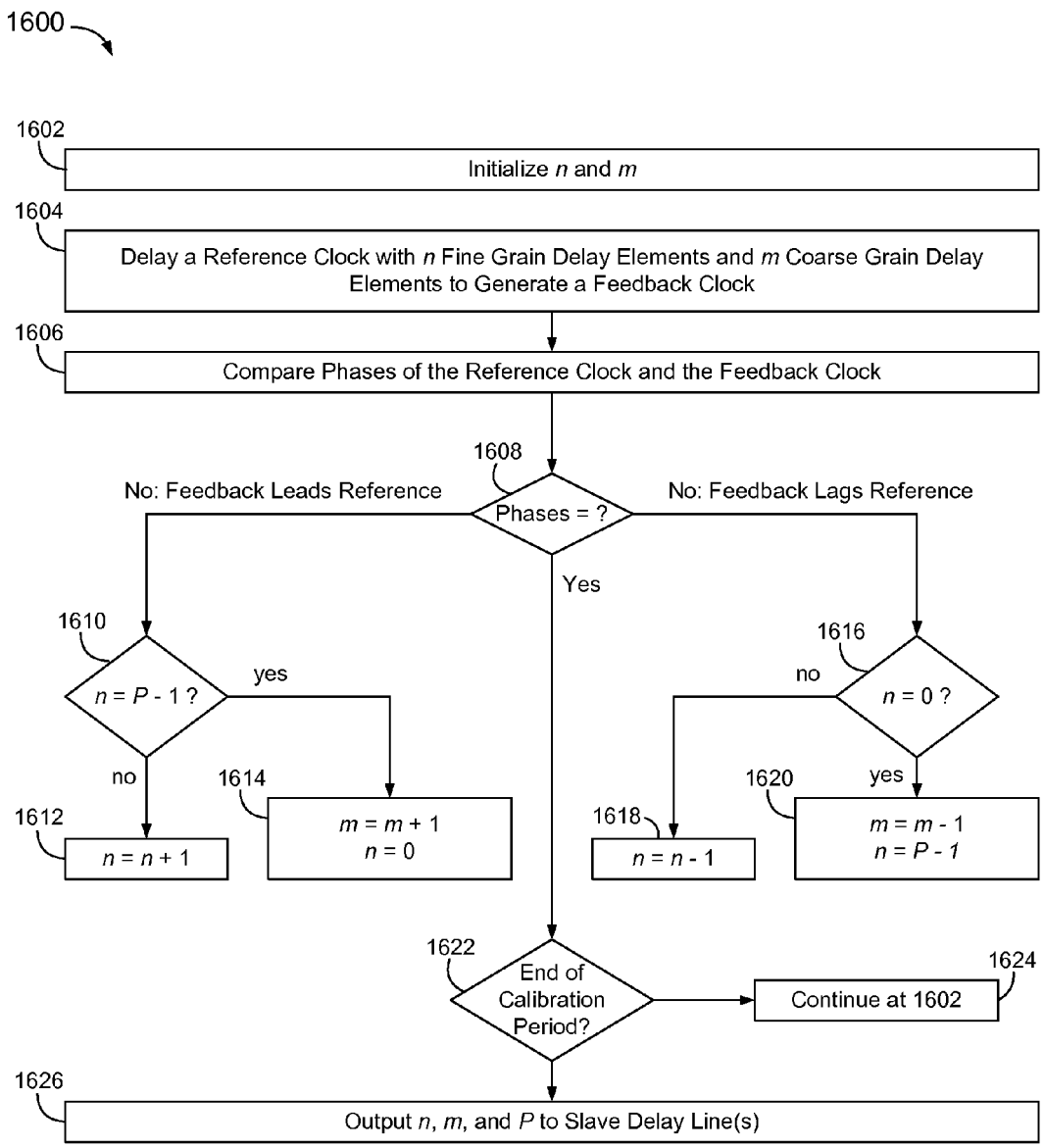
FIG. 16 is a flowchart of a method of calibrating number of fine grain delay elements, n, and a number of coarse grain delay elements, m, for which a combined delay corresponds to a period of a reference clock.

FIG. 16 is a flowchart of a method 1600 of calibrating the number of first delay elements, n, and the number of second delay elements, m, for which a combined delay corresponds to a period of a reference clock.

At 1602, n may be initialized to zero, and m may be initialized to a non-negative integer {0, 1, 2, ...}.

At 1604, a reference clock is delayed with n fine grain delay elements and m coarse grain delay elements to generate a feedback clock.

At 1606, phases of the reference clock and the feedback clock are compared. The comparing may include examining state transitions, such as rising or falling edges, and may include detecting a first-to-arrive based on state transitions.

The comparing may include comparing a leading edge of the feedback clock with leading edge of a subsequent cycle of the reference clock, to compute n and m to relative to a period of the reference clock.

At 1608, when the feedback clock leads the reference clock, processing proceeds to 1610 to increase the delay of the delay line.

At 1610, when n is less than P−1, n is incremented at 1610.

When n is equal to P−1 at 1610, m is incremented and n is reset to zero at 1614.

Returning to 1608, when the feedback clock lags the reference clock, processing proceeds to 1616 to decrease delay of the delay line.

At 1616, when n is greater than 0, n is decremented at 1618.

When n is equal to 0 at 1616, m is decremented and n is set to P−1 at 1620.

Calibration of n and m may continue as illustrated at 1624. Calibration of n and m may continue for a period of time, which may be a pre-determined period of time.

When calibration of n and m ends at 1622, calibrated values of P, n and m may be output at 1626, such as to a slave delay line.

One or more features disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, and/or a combination of integrated circuit packages.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the example embodiments herein.

What is claimed is:

1. A system, comprising:
    a digitally controllable delay line, including a plurality of first delay elements, each to provide a first amount of delay, and a plurality of second delay elements, each to provide a second amount of delay that is greater than the first amount of delay; and
    a digital controller including a first counter to enable a number n of the first delay elements and a second counter to enable a number m of the second delay elements, wherein the first and second counters are configured to perform base-P positional notation counting with n as a least significant count position and m as a most significant count position;
    wherein the digital controller is configured to calibrate n and m to control a delay of the delay line relative to a reference clock in increments of the first amount of delay; and
    wherein the digital controller includes a third counter to enable P first delay elements during a calibration of P, and is configured to increment the third counter during the calibration of P until a delay imparted to the reference clock by enabled first delay elements is equal to a delay imparted to the reference clock by one of the second delay elements.

2. The system of claim 1, wherein the first counter is configured to increment the second counter and set n to a lower limit when n is incremented above an upper limit, and to decrement the second counter and set n to the upper limit when n is decremented below the lower limit.

3. The system of claim 2, wherein the upper and lower limits differ by P−1.

4. The system of claim 1, wherein:
the first delay elements each include a capacitor and a switch to couple the capacitor to the delay line;
the delay line has a resistance; and
the first amount of delay is provided by a resistive-capacitive (RC) load of the capacitor and the resistance.

5. The system of claim 1, wherein:
the second delay elements each include a buffer and a multiplexer;
the buffers are coupled in series with one another; and
at least a subset of the multiplexers is controllable to output one of,
an output of an inverting buffer of the corresponding second delay element, and
an output of a multiplexer of an adjacent second delay element.

6. The system of claim 1, wherein:
substantially all logic circuitry that contributes delay to a reference clock applied to the delay line is contained within the first and second delay elements; and
calibration of P, n, and m substantially compensates for process, voltage, and temperature variations that affect the first and second delay elements.

7. A system, comprising:
a master delay locked loop (DLL), including,
a digitally controllable delay line, including a plurality of first delay elements, each to provide a first amount of delay, and a plurality of second delay elements, each to provide a second amount of delay that is greater than the first amount of delay and
a digital controller including a first counter to enable a number n of the first delay elements and a second counter to enable a number m of the second delay elements, wherein the first and second counters are configured to perform base-P positional notation counting with n as a least significant count position and m as a most significant count position,
wherein the digital controller is configured to calibrate n and m to control a delay of the delay line relative to a reference clock in increments of the first amount of delay, and
wherein the digital controller includes a third counter to enable P first delay elements during a calibration of P, and is configured to increment the third counter until a delay imparted to the reference clock by the enabled first delay elements is equal to a delay imparted to the reference clock by one of the second delay elements; and
a slave DLL to generate a slave clock based at least in part on digital calibration parameters of the master DLL; and
communication circuitry to communicate data based in part on the slave clock.

8. The system of claim 7, further including:
an integrated circuit device, including the master DLL, the slave DLL, the communication circuitry, and a data handling system to communicate through the communication circuitry.

9. The system of claim 8, wherein the data handling system includes a processor.

10. The system of claim 7, further including:
a circuit board, including the master DLL, the slave DLL, the communication circuitry, memory, and a processor to communicate with the memory through the communication circuitry.

11. The system of claim 7, wherein first counter is configured to increment the second counter and set n to a lower limit when n is incremented above an upper limit, and to decrement the second counter and set n to the upper limit when n is decremented below the lower limit.

12. The system of claim 11, wherein the upper and lower limits differ by P−1.

13. The system of claim 7, wherein:
the first delay elements each include a capacitor and a switch to couple the capacitor to the delay line;
the delay line has a resistance; and
the first amount of delay is defined by a resistive-capacitive (RC) load of the capacitor and the resistance.

14. A method, comprising:
digitally controlling a delay line that includes a plurality of first delay elements, each to provide a first amount of delay, and a plurality of second delay elements each to provide a second amount of delay that is greater than the first amount of delay wherein the digitally controlling includes,
digitally controlling a first counter to enable a number n of the first delay elements and a second counter to enable a number m of the second delay with base-P positional notation counting, with n as a least significant count position and m as a most significant count position, and
calibrating n and m to control a delay of the delay line relative to a reference clock, in increments of the first amount of delay, and
calibrating the count threshold P with a third counter, including incrementing the third counter until a delay imparted to the reference clock by the enabled first delay elements is equal to a delay imparted to the reference clock by one of the second delay elements.

15. The method of claim 14, wherein the digitally controlling further includes:
incrementing the second counter and setting n to a lower limit when the first counter is incremented above an upper limit; and
decrementing the second counter and setting n to the upper limit when the first counter is decremented below the lower limit.

16. The method of claim 15, wherein the upper and lower limits differ by P−1.

17. The method of claim 14, wherein the calibrating of n and m includes:
initializing n to zero and initializing and m to a non-negative integer;
delaying the reference clock with n first delay elements and m second delay elements to generate a feedback clock;
comparing phases of the reference clock and the feedback clock;
incrementing n when the feedback clock leads the reference clock and n is less than P−1;
incrementing m and setting n to zero when the feedback clock leads the reference clock and n is equal to P−1;
decrementing n when the feedback clock lags the second reference clock and n is greater than zero; and
decrementing m and setting n to P−1 when the feedback clock lags the reference clock and n is equal to zero.

* * * * *